US007035105B2

(12) United States Patent
Yamaguchi

(10) Patent No.: US 7,035,105 B2
(45) Date of Patent: Apr. 25, 2006

(54) POWER MODULE AND METHOD FOR PRODUCING THE SAME

(75) Inventor: Jun Yamaguchi, Yokkaichi (JP)

(73) Assignee: Sumitomo Wiring System, Ltd., Mie (JP)

( * ) Notice: Subject to any disclaimer, the term of this patent is extended or adjusted under 35 U.S.C. 154(b) by 336 days.

(21) Appl. No.: 10/691,502

(22) Filed: Oct. 24, 2003

(65) Prior Publication Data

US 2004/0160731 A1 Aug. 19, 2004

(30) Foreign Application Priority Data

Feb. 14, 2003 (JP) ............................ 2003-036469

(51) Int. Cl.
*H05K 7/20* (2006.01)

(52) U.S. Cl. ..................... 361/707; 165/80.3; 257/691; 257/712; 361/710; 361/715; 29/890.03

(58) Field of Classification Search ................. 29/80.3; 165/80.3; 257/706–707, 712–713, 691; 361/704–710, 361/715

See application file for complete search history.

(56) References Cited

U.S. PATENT DOCUMENTS 4,703,397 A * 10/1987 Minoura et al. ............ 361/826
4,899,256 A * 2/1990 Sway-Tin ................... 361/715
5,291,065 A * 3/1994 Arai et al. .................. 257/723
5,446,445 A * 8/1995 Bloomfield et al. ........ 340/521
5,646,827 A * 7/1997 Hirao et al. ................ 361/707
6,282,092 B1 * 8/2001 Okamoto et al. ........... 361/704

FOREIGN PATENT DOCUMENTS

JP A 11-204700 7/1999
JP A 2002-344177 11/2002

* cited by examiner

*Primary Examiner*—Gregory Thompson
(74) *Attorney, Agent, or Firm*—Oliff & Berridge, PLC

(57) ABSTRACT

A power circuit section including a plurality of bus bars is disposed through an insulation layer on a circuit arrangement surface of a heat radiation member. An end of each of the bus bars is folded up from the circuit arrangement surface to form an external connection terminal. An enclosure wall member that surrounds the power circuit section including the external connection terminal is disposed on the heat radiation member. A connector housing contains an external connection connector that comprises a bottom portion provided with terminal, a through-hole into which the external connection terminal is inserted, and a hood that surrounds the external connection terminal. The external connection connector can be coupled to another connector together with the external connection terminal. A waterproof layer is formed within the enclosure wall member so that at least a part of the power circuit section is sealed and the terminal through-hole is sealed.

18 Claims, 4 Drawing Sheets

36b 51 36 36 36b 31 3 36b 30 36a 33 38 53 32 53 34 10 12 13 12a 1 14 11 4 2a 5 2 20

36b
51
36
36
36b
31
3
30
36b
36a
33
38
53
32
53
34
10
13
12
12a
1
14
11
4
2a
5
2
20

2
20
4
37
36c
35
32
36c
37
33a
36c
37
51
30
36
33b
53
33c
53
38
52
36
36b 38
36
3
14
32
12
31
33c
39
36c
30
36a
11
6
2a
33b
33a
35
5
50
34
10
40
4
53
2
1
13
52
37
20

12
6
12a
13
11
15
10
10
12a
13

POWER MODULE AND METHOD FOR PRODUCING THE SAME

CLAIM FOR PRIORITY

The present invention claims priority to Japanese Patent Application JP-A-2003-036469 filed Feb. 14, 2003.

BACKGROUND OF THE INVENTION

1. Field of Invention

This invention relates to a power module in which a power circuit section including a bus bar and a semiconductor device is disposed through an insulation layer on a heat radiation member. This invention also relates to a method for producing the power module, and more particularly relates to a power module that can be used as, for example, a power distributor for a vehicle for distributing an electrical power to a plurality of electronic units from a common power source on a vehicle, and to a method for producing the power module.

2. Description of Related Art

Heretofore, as means for distributing a power to each electronic unit from a common power source on a vehicle, a junction box has been known which constitutes a power circuit section in which a plurality of bus bar boards are laminated, and a fuse and a relay switch are incorporated on the boards.

Such junction box contains the power circuit section described above in a casing having a lower casing member and an upper casing member. In view of prevention of a short circuit, the upper and lower casing members are coupled to each other in a waterproofing manner, thereby waterproofing an interior of the casing.

Recently, in order to perform a downsizing of a junction box that distributes an electrical power to each electronic unit from a common power source on a vehicle and a high speed switching control, a power module has been developed in which a semiconductor switching device, such as an FET (field-effect transistor), is disposed between an input terminal and an output terminal. In the power module, a power circuit section is arranged on a circuit arrangement surface of a heat radiation member in order to remove a heat generated from the semiconductor. For example, see Japanese Patent Public Disclosure No. HEI 11-204700.

It is necessary to prevent a short circuit in even the power module disclosed in Japanese Patent Public Disclosure No. HEI 11-204700, just as in the case of a conventional junction box. Accordingly, a power circuit section in the power module requires a waterproof function. However, a specific structure for a waterproof function has not been disclosed yet.

Japanese Patent Public Disclosure No. HEI 11-204700 discloses that a semiconductor or the like in a central part of a circuit is transfer-molded or potted with a resin. However, even if this is a purpose for waterproof, an additional waterproof treatment must be done to prevent a short circuit between terminals projecting upwardly from a periphery of a circuit. An efficiency of production will be lowered in association with increase of such fine steps. It is impossible to easily and surely waterproof the entire power module.

In view of the above problems, an object of the present invention is to provide a power module in which a simple structure can effectively waterproof an entire power module as well as a connector, and to provide a method for producing the power module.

SUMMARY OF THE INVENTION

In order to solve the above problems, the embodiments of the present invention are directed to a power module, wherein a power circuit section including a plurality of bus bars is disposed through an insulation layer on a circuit arrangement surface of a heat radiation member. The power module includes an external connection terminal formed by folding up an end of each of the bus bars from the circuit arrangement surface, an enclosure wall member disposed on the heat radiation member to surround the power circuit section including the external connection terminal, a connector housing including an external connection connector, and a waterproof layer formed within the enclosure wall member so that at least a part of the power circuit section and the terminal through-hole are sealed. The external connection connector includes a bottom portion provided with a terminal through-hole and a hood that surrounds the external connection terminal. The external connection terminal is inserted into and projects through the terminal through-hole toward the opposite side from the circuit arrangement surface. The external connection connector can be coupled to another connector together with the external connection terminal.

According to the embodiments of the present invention, because the waterproof layer is formed within the enclosure wall member and the waterproof layer seals at least a part of the power circuit section, it is possible to effectively waterproof the power circuit section. Furthermore, the waterproof layer also seals the terminal through-hole. Because the terminal through-hole in the connector housing is sealed by utilizing the waterproof layer that seals the power circuit section, it is possible to waterproof the external connection terminal including the terminal through-hole by a simple structure, and it is also possible to effectively waterproof a whole of the power module as well as the connector.

In the embodiments of the power module, the waterproof layer is preferably formed by filling an inside of the enclosure wall member with a liquid waterproof resin, flowing a part of the waterproof resin through the terminal through-hole into the connector housing, and solidifying the waterproof resin. According to this structure, it is possible to seal at least a part of the power circuit section and the terminal through-hole merely by filling the inside of the enclosure wall member with the waterproof resin, thereby enhancing an efficiency of production.

Although the connector housing may be separated away from the enclosure wall member, the connector housing is preferably integrated with the enclosure wall member.

In the embodiments of the power module, the connector housing is provided in a bottom wall, except a connector contact surface on which a distal end of another connector contacts, with a resin reservoir recess depressed toward the heat radiation member. The terminal through-hole is formed in the resin reservoir recess. A top surface of the waterproof layer is disposed within the resin reservoir recess. According to this structure, because the top surface of the waterproof layer is disposed within the resin reservoir recess, it is possible to surely seal the terminal through-hole, thereby waterproofing the external connection terminal including the terminal through-hole. Furthermore, because the top surface of the waterproof layer is disposed within the resin reservoir recess depressed from the connector contact surface, it is possible to dispose the waterproof layer at a fitting position by contacting a distal end surface of another connector with the connector contact surface without contacting the waterproof layer with another connector. Accordingly, in the case where the waterproof layer that projects into the connector housing so as to seal the terminal through-hole connects another connector, the waterproof layer will not interfere with another element. For example, even if the waterproof layer is made of a resin having a certain viscosity, the waterproof layer will not stick to another connector, or will not form a film on a part of the external connection terminal to be inserted into another connector, thereby avoiding a contact failure.

In addition, the number of the terminal through-hole provided in the resin reservoir recess is not limited. The resin reservoir recess may be provided every terminal through-hole. A plurality of terminal through-holes may be provided in the resin reservoir recess. According to this structure, because the plural terminal through-holes are provided in the resin reservoir recess, the top surface of the waterproof layer for sealing the respective terminal through-holes will become uniform. It is possible to prevent water from entering into some terminal through-holes.

A method for producing a power module in accordance with various embodiments of the present invention includes arranging on a circuit arrangement surface of a heat radiation member a power circuit section, attaching closely to the circuit arrangement surface an enclosure wall member that surrounds the power circuit section including the external connection terminal;, forming an external connection connector adapted to be coupled to another connector through the external connection terminal, and forming a waterproof layer for sealing at least a part of the power circuit section and for sealing the terminal through-hole. The waterproof layer can be formed by filling a space enclosed by the enclosure wall member with a liquid waterproof resin, flowing the waterproof resin into the connector housing to a given level, and solidifying the waterproof resin. The power circuit section includes a plurality of bus bars and an external connection terminal formed by folding up an end of at least one of the bus bars, The external connection connector can be coupled to another connector through the external connection terminal that is inserted into the terminal through-hole in a connector housing. The connector housing includes a bottom portion provided with the terminal through-hole into which the external connection terminal is inserted and a hood that surrounds the external connection terminal that projects through the terminal through-hole toward the opposite side from the circuit arrangement surface.

According to the method for producing the power module of the present invention, because the waterproof layer is formed to seal at least a part of the power circuit section by filling the space enclosed by the enclosure wall member with the liquid waterproof resin and solidifying it, it is possible to waterproof the power circuit section. On the other hand, because a part of the waterproof resin flows through the terminal through-hole into the connector housing, and because the waterproof resin in the connector housing forms the waterproof layer that seals the terminal through-hole, it is not necessary to add a step for waterproofing the connector housing. Thus, it is possible to effectively and easily waterproof a whole of the power module as well as a connector. A simple waterproof for connector will enhance an efficiency of production. Because the waterproof resin in a liquid form is used, the resin can flow into every corner in the enclosure wall member and connector housing, thereby forming a complete waterproof layer.

In the method of the present invention, the enclosure wall member integrated with the connector housing is attached to the circuit arrangement surface in the second and third steps (e.g., enclosure wall forming-step and connector forming-step). According to this construction, it is possible to produce the enclosure wall member and connector housing at the same time. Furthermore, because the enclosure wall member integrated with the connector housing is attached to the circuit arrangement surface, it is possible to carry out the enclosure wall forming-step and the connector forming-step simultaneously, thereby enhancing an efficiency of production.

Preferably, the enclosure wall member has a seal member for a resin on an end surface opposed to the heat radiation member. The enclosure wall member is attached to the circuit arrangement surface in the second step so that the seal member for a resin contacts the circuit arrangement surface closely. According to this construction, even if there is a clearance between the enclosure wall member and the heat radiation member, the seal member for resin closes the clearance and the liquid waterproof resin can be prevented from flowing out from the clearance. Accordingly, it is possible to surely form the waterproof layer within the enclosure wall member including the connector housing by filling them with a given amount of waterproof resin.

In the producing method of the embodiments of the present invention, preferably, the third step (connector forming-step) uses, as a connector housing forming the external connection connector, a connector housing provided in a bottom wall, except a connector contact surface on which a distal end of another connector contacts, with a resin reservoir recess that is depressed toward the heat radiation member and is provide with a terminal through-hole. Preferably, the fourth step (waterproof layer forming-step) fills the resin reservoir recess with the waterproof resin until a top surface of the waterproof layer reaches a given level in the resin reservoir recess. According to this construction, because the top surface of the waterproof layer is positioned in the resin reservoir recess, it is possible to surely seal the terminal through-hole and to waterproof the external connection terminal including the terminal through-hole. Furthermore, it is possible to precisely dispose the waterproof layer at the fitting position by contacting the distal end surface of another connector with the connector contact surface without contacting the waterproof layer with another connector.

A size and a depth of the resin reservoir recess are not limited. It is preferable to determine them in consideration of a height and the like of the power circuit section. In particular, in the case where the power circuit section includes one or more electronic parts having a leg-like terminal, the third step (connector forming-step) uses, as a connector housing forming the external connection connector, a connector housing in which a bottom surface of the resin reservoir recess is set to be higher than an upper end of the leg-like terminal upon filling of the waterproof resin, preferably. According to this construction, it is possible to seal the power circuit section including the leg-like terminal of the electronic parts when the terminal through-hole is sealed. A little amount of waterproof resin can effectively waterproof a whole of the power module. Furthermore, when the waterproof resin flows over into the resin reservoir recess, the power circuit section including the leg-like terminal of the electronic parts can be waterproofed. This indicates a reference of a filling amount of waterproof resin.

In the invention relating to a method for producing a power module, the third step uses preferably, as a connector housing forming the external connection connector, a connector housing in which an upper edge of the resin reservoir recess is set to be higher than an upper end of the electronic parts upon filling of the waterproof resin. According to this structure, it is possible to seal a whole of the electronic parts with the waterproof layer. Because the waterproof resin does not flow out from the resin reservoir recess under even this condition, it is possible to surely waterproof a whole of the power module and to ensure a good connection between the external connection connector and another connector.

BRIEF DESCRIPTION OF THE DRAWINGS

The features of the present invention believed to be novel and the elements characteristic of the present invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF EXEMPLARY EMBODIMENTS

Figure 1:
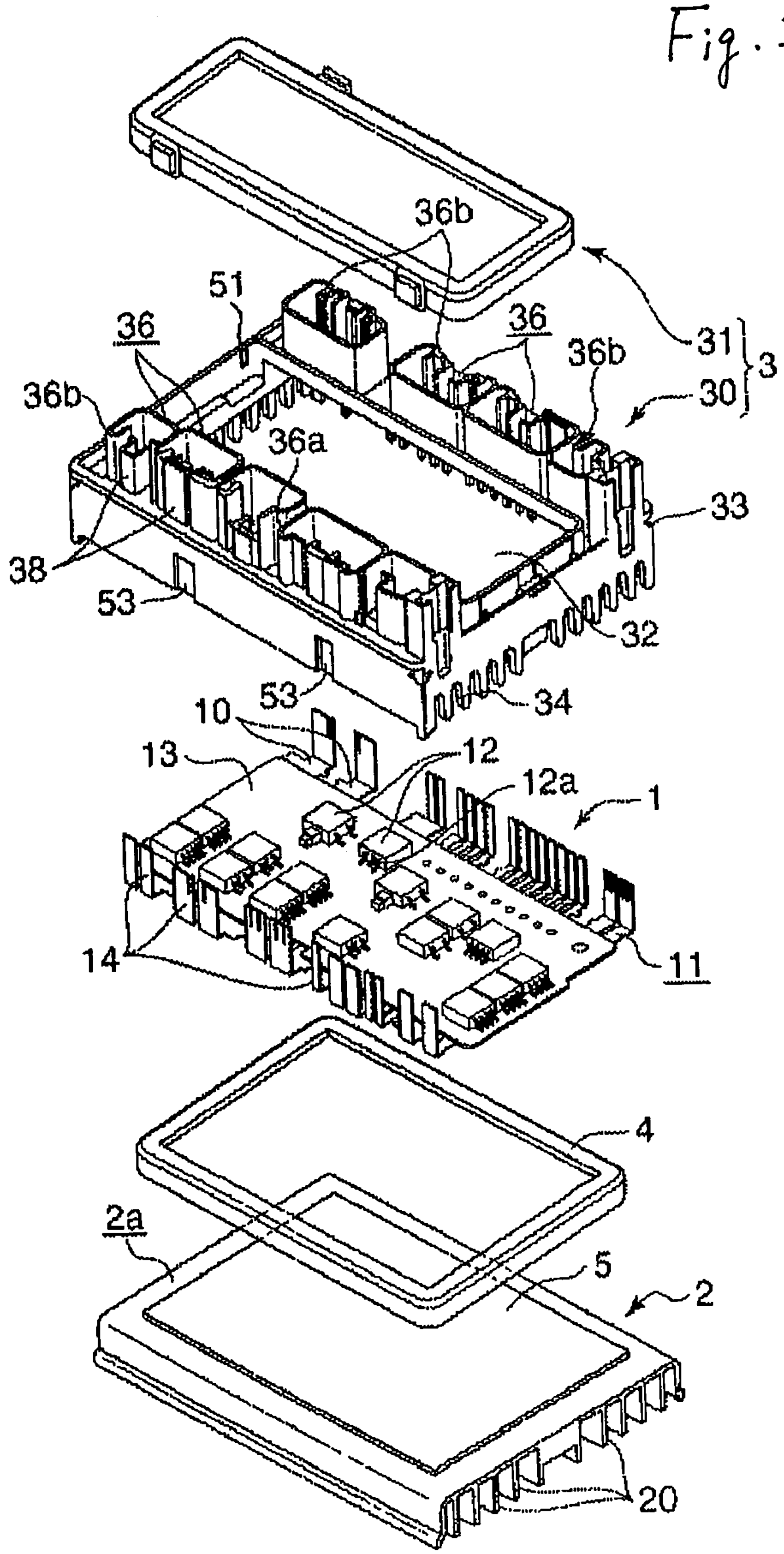
FIG. 1 is an exploded perspective view of an embodiment of a power module in accordance with the present invention.

In describing the preferred embodiment of the present invention, reference will be made herein to FIGS. 1 to 5 of the drawings in which like numerals refer to like features of the invention. Features of the invention are not necessarily shown to scale in the drawings.

Referring now to the drawings, embodiments of a power module and a method for producing the power module in accordance with the present invention will be described below. A power module that distributes an electrical power supplied from a common power source on a vehicle or the like to a plurality of electrical loads is described here. However, the present invention is not limited to this power module but can be generally applied to a power module having a heat radiation member and required for waterproof.

Figure 4:
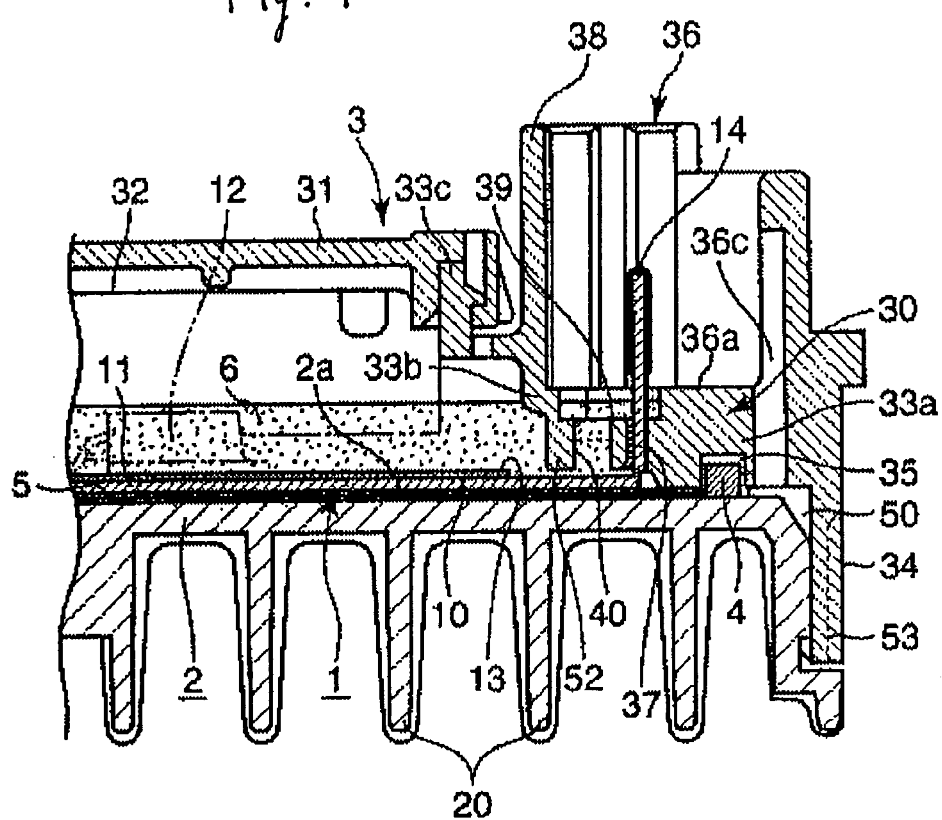
FIG. 4 is a cross section of the enclosure wall member taken along line IV—IV in FIG. 3.

FIG. 1 is an exploded perspective view of an embodiment of a power module in accordance with the present invention. The power module comprises a power circuit section 1 including a plurality of bus bars 10, a heat radiation member 2 on which the power circuit section 1 is arranged through an insulation layer 5, and a casing 3 for covering the power circuit section 1. As shown in FIG. 4, the casing 3 and heat radiation member 2 are coupled to each other with a seal member 4 for a resin being disposed in the casing 3 to be clamped between them. Under this condition, a waterproof resin is filled in the coupled casing and heat radiation member to form a waterproof layer 6.

As shown in FIG. 1, the power circuit section 1 includes: a bus bar assembly plate 11 in which a plurality of bus bars 10 are arranged within a given polygon area (rectangle area in this embodiment), with ends of the bus bars 10 projecting from the same plane in a given pattern (right and left side edges in FIG. 1); a plurality of FETs (field-effect transistors) or semiconductor switching devices 12 interposed between bus bars 10 for input and output terminals; and a control circuit board 13 mounted on one side (front side in FIG. 1) of the bus bar assembly plate 11 for controlling a switching operation of the FETs 12. The respective FETs 12 are mounted on both bus bar assembly plate 11 and control circuit board 13 to form an electrical connection.

Thus, because the power circuit section 1 directly interconnects the bus bar assembly plate 11 and the control circuit board 13 to each other and the respective FETs 12 are electrically connected to them, it is possible to form the power circuit section 1 into a compact size, in particular, in a thickness direction.

As shown in FIG. 1, an end of a given bus bar 10 in the bus bar assembly plate 11 is folded up into a given shape to form an external connection terminal 14. In the present embodiment, ends of the bus bars 10, which project from the right and left side edges of the substantially rectangular area on which the bus bars 10 are arranged, are folded up substantially in the vertical direction to form the external connection terminals 14. These external connection terminals 14 serve as, for example, input terminals to be connected to a common power source on a vehicle, output terminals to be connected to electronic units, or signal input terminals to which a control signal is applied to control a switching operation of the FETs 12.

Figure 5:
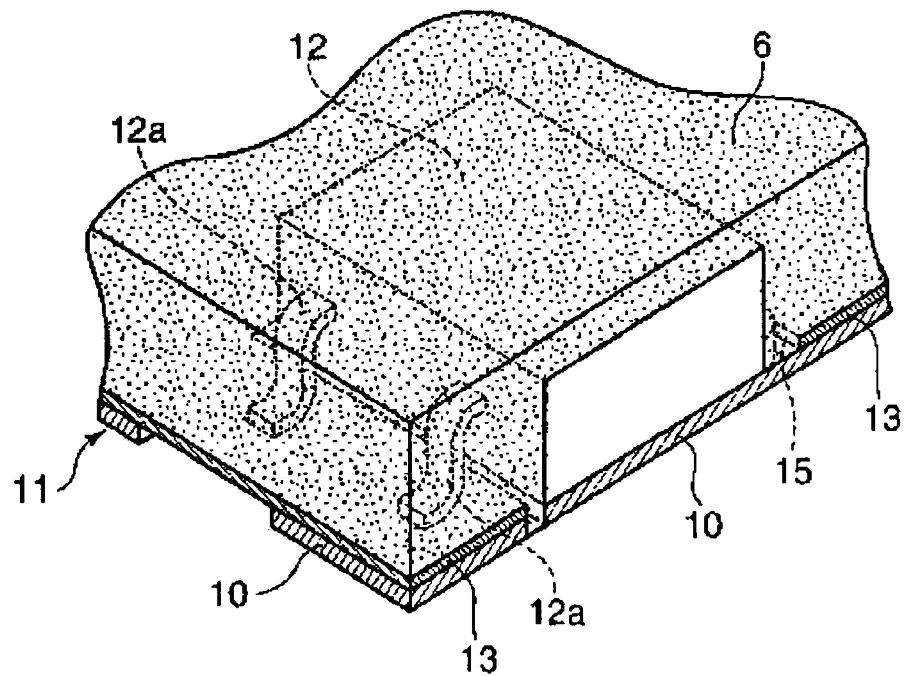
FIG. 5 is a perspective view of an FET, illustrating the FET whose leg-like terminals are sealed with a waterproof resin.

As shown in FIGS. 1 and 5, the FETs 12 have a substantially rectangular parallelepiped configuration. Each FET 12 is provided on the side surfaces with a plurality of leg-like terminals **12*a* (two terminals on each side surface in this embodiment). These terminals 12*a* are electrically connected to the bus bar assembly plate 11 and control circuit board 13. In more detail, a source terminal and a drain terminal of the FET 12 are connected to the bus bar 10 while a gate terminal of the FET 12 is connected to the control circuit board 13**.

The control circuit board 13 includes, for example, a usual printed board. In this embodiment, a thin sheet-like board is used. Through-holes 15 are provided in given positions on the control circuit board 13 (see FIG. 5). Each FET 12 is mounted through each through-hole 15 on the bus bar 10.

It is possible to change a shape of the bus bar assembly 11 and an arrangement pattern of the bus bars 10, if desired. It is also possible to use another electronic part having a leg-like terminal, such as a relay, an LSI (large-scale integrated circuit), a thyristor or the like in addition to or in lieu of the FET 12. Furthermore, it is possible to arrange the control circuit board 13 above the FET 12.

Figure 2:
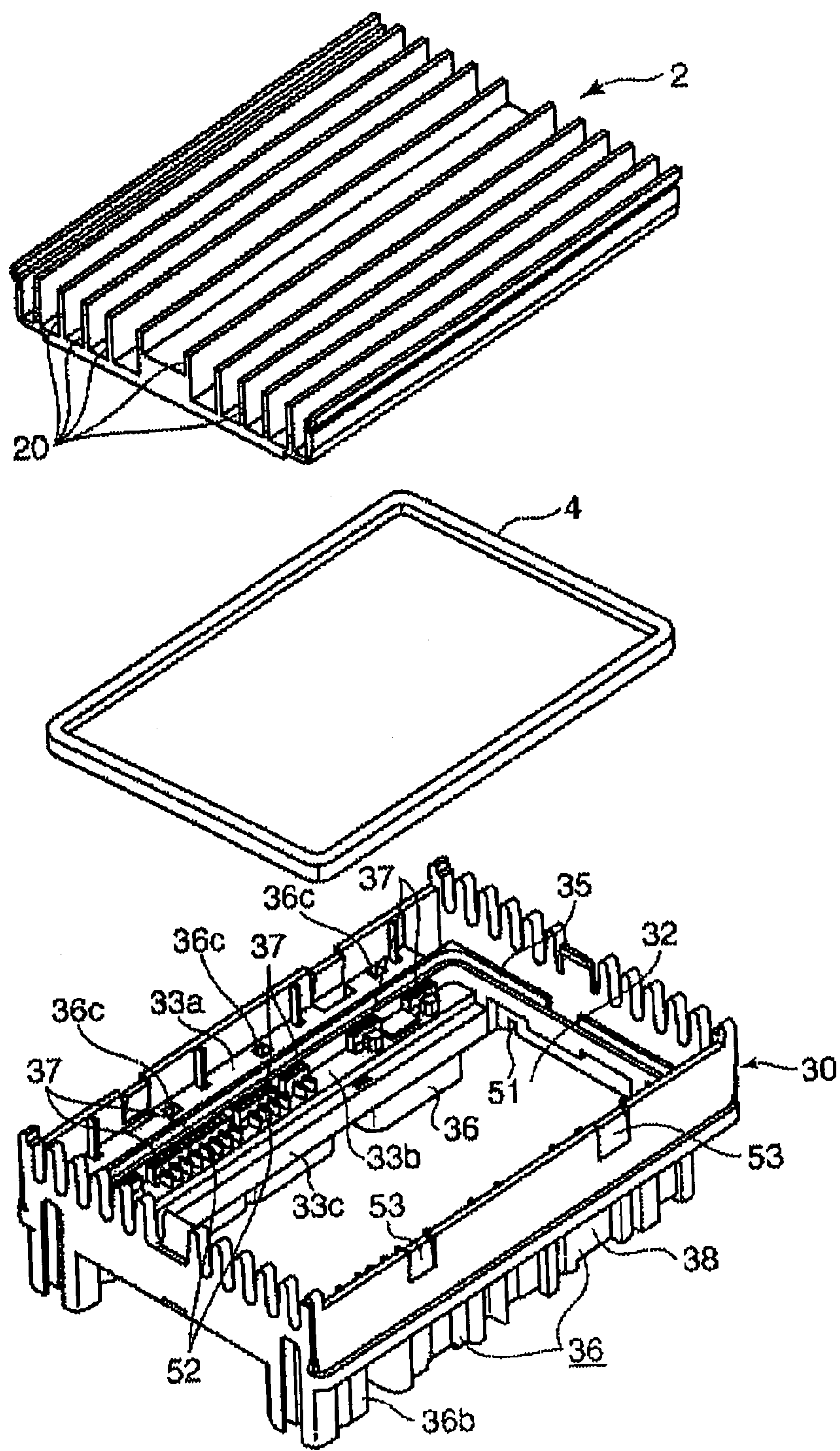
FIG. 2 is an exploded perspective view of the power module taken from a bottom side of FIG. 1, illustrating an enclosure wall member, a seal member for a resin, and a heat radiation member.

The heat radiation member 2, as shown in FIGS. 1 and 2, is made of a material having a good heat conductivity, such as an aluminum base metal or the like and is formed into a substantially rectangle in plan view. The heat radiation member 2 has a flat circuit arrangement surface **2*a* at a front side. A plurality of heat radiation fins 20 are disposed on the right and left sides (in FIG. 2) of a bottom surface of the heat radiation member 2 and extend downwardly. A circuit arrangement area is provided on the circuit arrangement surface 2*a* to support the power circuit section 1. The insulation layer 5 is disposed on the circuit arrangement surface 2*a* to extend over the circuit arrangement area. The insulation layer 5 is thermally connected to the heat radiation member 2. For example, the insulation layer 5 is formed by applying an adhesive having a high insulation property to the circuit arrangement surface 2*a* and drying it. Such an adhesive could be include an epoxy base resin, a silicone base adhesive or the like. Alternatively, an insulation sheet may be adhered to the circuit arrangement surface 2*a*. In the present invention, the insulation layer 5 is formed by applying an adhesive composing an epoxy base resin having high insulation and good heat conductivity to the circuit arrangement surface 2***a*.

The heat radiation fins 20 may be omitted. Alternatively, heat radiation pins may be used in place of the heat radiation fins 20 to project from a side opposite from the circuit arrangement surface 2*a*. The heat radiation fins 20, the heat radiation pins, or the like may be provided on their surfaces with fine grooves to increase their surface areas, thereby enhancing an efficiency of heat radiation.

The casing 3 is made of an insulation material. As shown in FIGS. 1 and 2, the casing 3 includes tube-like enclosure wall member 30 and a lid 31 for closing an upper opening 32 in the enclosure wall member 30.

The enclosure wall member 30, as shown in FIGS. 1, 2, and 4, includes a wall body 33 whose lower end surface extends along a peripheral edge of the circuit arrangement surface 2*a*, a skirt 34 that extends downwardly from a periphery of the wall body 33 to cover a peripheral side surface of the heat radiation member 2, and a seal member 4 for a resin provided on the lower end surface of the wall body 33. The-enclosure wall member 30 can surrounds the power circuit section 1 or the circuit arrangement area of the heat radiation member 2.

The wall body 33 has a configuration that surrounds the circuit arrangement area of the heat radiation member 2. As shown in Figure. 4, the wall body 33 includes a first vertical wall portion 33*a*, a horizontal wall portion 33*b* extending inwardly from an end edge of the-first vertical wall portion 33*a*, and a second vertical wall portion 33*c* extending further upwardly (in a direction opposite from the heat radiation member 2) from an end of the horizontal wall portion 33*b*. The first vertical wall portion 33*a* is provided in a whole lower end surface with a seal member fitting-groove 35. The seal member fitting-groove 35 surrounds the circuit arrangement area of the circuit arrangement surface 2*a*. The seal member 4 for a resin is fitted in the seal member fitting-groove 35. A cross sectional shape of the seal member fitting-groove 35 is not limited. In the present embodiment, the seal member fitting-groove 35 is formed into a U-shape in cross section.

A height of the wall body 33 is greater than that of at least the leg-like terminal 12*a* of the FET 12 mounted on the power circuit section 1. Preferably, the height of the wall body 33 is greater than those of the respective electronic parts. The wall body 33 can surrounds the power circuit section 1 including the respective electronic parts (FETs 12 in this embodiment). In the present invention, the wall body 33 is higher than the FETs 12.

The wall body 33 is provided so that the upper end opening 32 is opposed to the circuit arrangement area on the circuit arrangement surface 2*a*. After the enclosure wall member 30 is attached to the heat radiation member 2, the power circuit section 1 disposed on the heat radiation member 2 can be seen through the upper end opening 32. The upper end opening 32 is used when the waterproof resin is filled within the enclosure wall member 30. The upper end opening 32 serves as a window for an operation of pushing the power circuit section 1 onto the heat radiation member 2 when the power circuit section 1 is connected to the heat radiation member 2.

In the embodiments of the present invention, the connector housing 36 is integrated with the wall body 33. The connector housing 36 includes a bottom portion having terminal through-holes 37 into which the external connection terminals 14 of the power circuit section 1 are inserted, and hoods 38 that surrounds a plurality of external connection terminals 14 projecting through the terminal through-holes 37 in a direction opposite from the circuit arrangement surface 2*a*. The connector housing 36 together with the external connection terminal 14 include an external connection connector adapted to be connected to another connector. In this embodiment, the connector housing 36 is provided on a bottom with the horizontal wall portion 33*b*.

In more detail, the terminal through-holes 37 are provided in the horizontal wall portion 33*b* at the opposite sides of the upper end opening 32. The external connection terminal 14 of the power circuit section 1 is inserted through the terminal through-hole 37 into the horizontal wall portion 33*b*. The horizontal wall portion 33*b* is provided on an upper surface with the plural hoods 38 extending toward a direction opposite from the heat radiation member 2 to surround the plural terminal through-holes 37. The hoods 38 and horizontal wall position 33*b* around the terminal through-holes 37 constitute the connector housing 36. The connector housings 36 are arranged on the right and left sides of the upper end opening 32 along the longitudinal direction of the wall body 33. One or more external connection terminals 14 project into the connector housing 36. The connector housing 36 and the one or more external connection terminals 14 constitute the external connection connector that can be connected to another connector.

Figure 3:
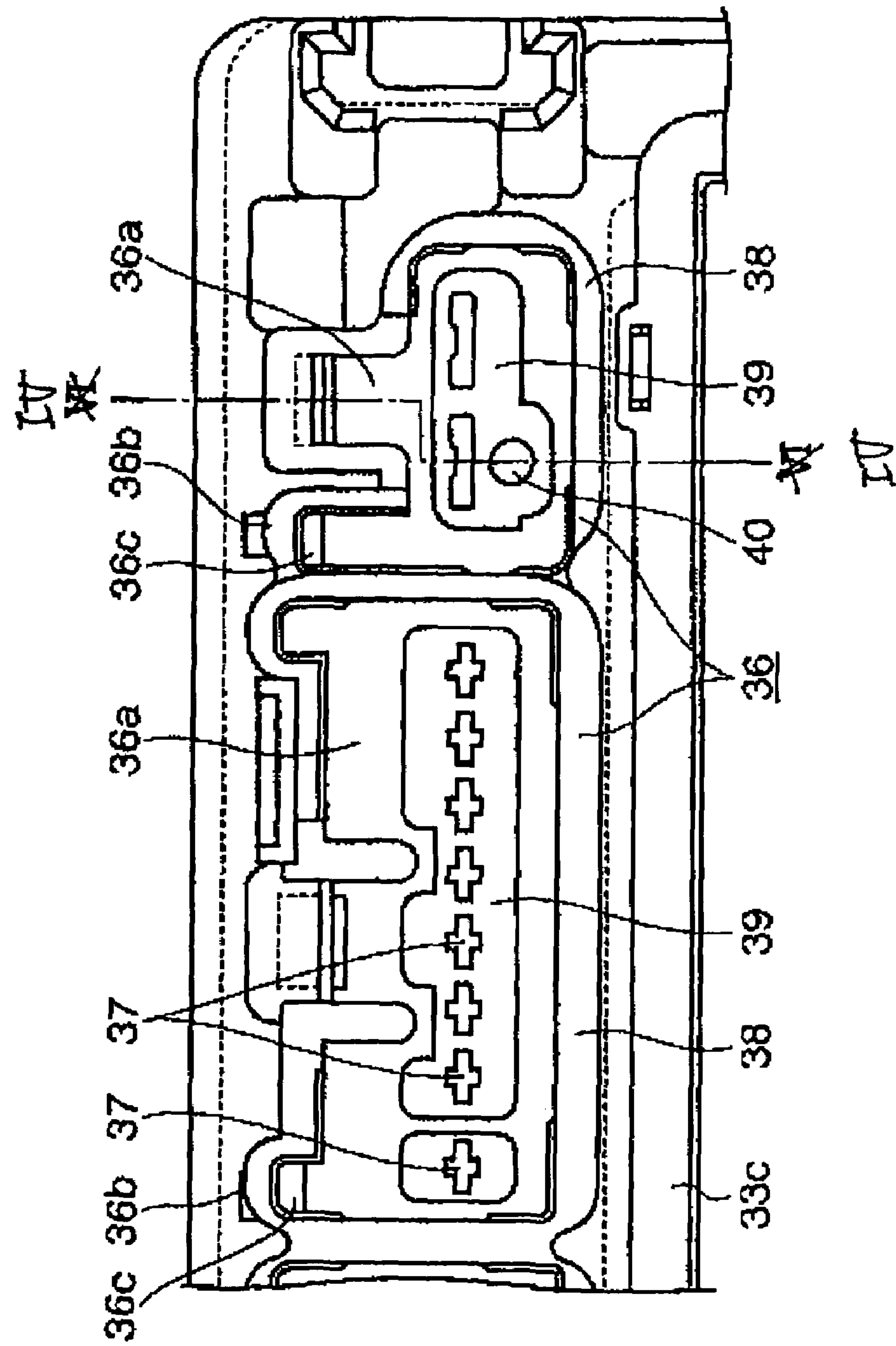
FIG. 3 is a partially enlarged plan view of the enclosure wall member in the power module.

As shown in FIG. 3, the terminal through-hole 37 is formed into a crisscross or a flat shape in cross section. After the external connection terminals 14 are inserted into the terminal through-holes 37, a waterproof resin described after can easily pass the terminal through-holes 37 and can flow into the connector housings 36 while keeping an alignment of the terminals 14. The shape of the terminal through-hole 37 is not limited. If the terminal through-hole 37 is formed larger than a shape in cross section of the external connection terminal 14, the waterproof resin will easily flow into the connector housing 36. The alignment of the external connection terminals 14 can be obtained, if the terminal through-hole 37 partially overreaches the corresponding cross section of the external connection terminal 14.

On the other hand, as shown in FIGS. 3 and 4, the connector housing 36 is provided in a bottom wall, except a connector contact surface 36*a* on which a distal end of another connector contacts, with a resin reservoir recess 39 depressed below (toward the heat radiation member 2) the connector contact surface 36*a*. The terminal through-holes 37 are provided in the area in which the resin reservoir recess 39 is formed. As shown in FIGS. 3 and 4, a resin insertion hole 40 is provided in the inside of the wall body 33 from the resin reservoir recess 39, in particular, the underside of the horizontal wall portion 33*b* in some connector housings 36.

The resin reservoir recess 39 reserves the waterproof resin through the terminal through-holes 37. A waterproof layer 6 described after is formed in the resin reservoir recess 39 to prevent water from entering the terminal through-hole 37, thereby effectively preventing a short circuit of the power circuit section 1. The waterproof resin overflows through the terminal through-holes 37 into the resin reservoir recess 39. On the other hand, the resin insertion hole 40 serves to assist in and promote a flow of the waterproof resin from the terminal through-holes 37. The waterproof resin flows through the resin insertion hole 40 into the resin reservoir recess 39.

A shape in plan view and a size of the resin reservoir recess 39 are not limited. However, it is preferable to space an outer peripheral edge of the resin reservoir recess 39 away from the terminal through-holes 37 at a given distance in a plan view. The reason why the outer peripheral edge of the resin reservoir recess 39 is spaced away from the terminal through-holes 37 at a given distance in a plan view is to fill the waterproof resin around the terminal through-holes 37 sufficiently.

As shown in FIG. 3, a plurality of terminal through-holes 37 is provided in the resin reservoir recess 39. However, only one terminal through-hole 37 may be provided in the resin reservoir recess 39. In the case where the plural terminal through-holes 37 are provided in the resin reservoir recess 39, as shown in FIG. 3, all of the terminal through-holes 37 in the connector housing 36 may be provided in the resin reservoir recess 39 or some of the terminal through-holes 37 may be provided in the resin reservoir recess 39. Even if a plurality of terminal through-holes 37 are provided in the resin reservoir recess 39, a rib is provided between the terminal through-holes 37 and the resin reservoir recesses 39 adjacent the opposite sides of the rib may be communicated with each other.

A height to a bottom of the resin reservoir recess 39 is set to be greater than a height of an upper edge of the leg-like terminal 12*a* of the FET 12 upon filling the waterproof resin. That is, the height to the bottom of the resin reservoir recess 39 with respect to the circuit arrangement surface 2*a* is set to be greater than the upper edge of the leg-like terminal 12*a* of the FET 12 with respect to the circuit arrangement surface 2*a*. Accordingly, when the waterproof resin overflows through the resin insertion hole 40 into the resin reservoir recess 39, the leg-like terminal 12*a* of the FET 12 is sealed within the wall body 33, as shown in FIG. 5. In the embodiments of the present invention, the height to the bottom of the resin reservoir recess 39 is set to be substantially equal to the height of the FET 12. A height to the upper edge of the resin reservoir recess 39 is set to be greater than the height of the FET 12.

In the case where the connector housing 36 is disposed vertically, a lower end of the connector housing 36 extends outwardly. A drainage hole 36*c* is provided in the horizontal wall portion 33*b* within the outwardly extending portion 36*b* of the connector housing 36. The drainage hole 36*c* opens at the outside of the resin seal member 4 and at the side of the heat radiation member 2. The drainage hole 36*c* serves to drain water reserved in the connector housing 36. The water drained from the drainage hole 36*c* flows through a drainage passage 50 defined between the heat radiation member 2 and the enclosure wall member 30 to the outside.

In the case where the power module is disposed vertically, the second vertical wall portion 33*c* is provided in a lower portion with a drainage notch 51 (FIG. 1). The water drainage notch 51 is disposed at the same level as or above a surface of the waterproof layer 6. The horizontal wall portion 33*b* is provided on a rear side with a stop projection 52 for stopping the bus bars 10 constituting the external connection terminals 14.

The skirt 34 is formed into a frame-like configuration surrounding a periphery of the heat radiation member 2. A pair of opposed sidewalls of the skirt 34 are formed into projections and depressions corresponding to the heat radiation fins 20. The skirt 34 is provided with latch pawls 53 for engaging portions corresponding to the heat radiation member 2. The latch pawls 53 firmly couple the enclosure wall member 30 and the heat radiation member 2 to each other.

The lid 31 is formed into a plate-like configuration corresponding to the upper end opening 32 of the enclosure wall member 30. The lid 31 is attached to the enclosure wall member 30 by engagement means (not shown). Although the lid 31 may be omitted, if desired, it will be preferable to provide the lid 31 to avoid a exposure of an interior of the enclosure wall member 30 and to protect the power circuit section 1 from an external impact.

The seal member 4 for a resin is formed into an annular configuration that surrounds the circuit arrangement area. The seal member 4 for a resin serves to prevent the waterproof resin from leaking out from the enclosure wall member 30 until a liquid waterproof resin described after is solidified. Accordingly, the seal member 4 is not required for durability for a long term and can be made of an inexpensive material. A material of the seal member 4 is not limited. However, it is preferable to select a material having elasticity (for example, a foam rubber having closed cells) to surely close a clearance between the wall body 33 and the heat radiation member 2. A material of the seal member 4 is not limited. A chloroprene rubber or the like will be preferable in view of cost efficiency, general versatility, workability, or the like.

Because the waterproof layer 6 is explained in connection with a method for producing a power module described after, an explanation of the waterproof layer 6 is omitted here. Next, a method for producing a power module will be explained below.

A method for producing a power module includes steps of forming the power circuit section 1 and heat radiation member 2 (a power circuit section forming step and a heat radiation member forming step) and steps of forming the enclosure wall member 30 (e.g., an enclosure wall forming-step and a connector housing forming step).

The seal member 4 for a resin is closely fitted in the seal member fitting-groove 35 in the enclosure wall member 30. The power circuit section 1 is attached to the enclosure wall member 30 with the external connection terminals 14 being inserted into the terminal through-holes 37. It is possible to keep an alignment of the external connection terminals 14 by attaching the power circuit section 1 to the enclosure wall member 30 beforehand.

Next, the same adhesive as that of forming the insulation layer 5 is applied to the circuit arrangement area on the heat radiation member 2. The seal member 4 for a resin is closely contacted with the circuit arrangement surface 2*a* to surround the circuit arrangement area of the heat radiation member 2. The enclosure wall member 30, to which the power circuit section 1 is attached, is attached to the heat radiation member 2. Then, the power circuit section 1 is joined to the circuit arrangement area on the circuit arrangement surface 2*a* of the heat radiation member 2 by means of the adhesive.

The latch pawls 53 of the skirt 34 engage the heat radiation member 2 to secure the enclosure wall member 30 to the heat radiation member 2. The enclosure wall member 30 maybe secured to the heat radiation member 2 by mechanical fastening means such as screws, bolts, or the like, chemical means such as an adhesive, or well known attaching means. In the case where the waterproof resin having an adhesive property is used, the enclosure wall member 30 may be attached to the heat radiation member 2 temporarily.

In order to attach the power circuit section 1 to the circuit arrangement area of the heat radiation member 2, the same adhesive as that of forming the insulation layer 5 (e.g., an adhesive composing an epoxy-base resin in the present embodiment) is applied to the circuit arrangement area. Another adhesive such as an adhesive having a high heat conductivity may be used. The adhesive must form the insulation layer 5 surely. Even if a pinhole is generated in the insulation layer 5 upon forming it, the adhesive for adhering the power circuit section 1 to the heat radiation member 2 embeds the pinhole by an applying work of the adhesive and forms a part of the insulation layer 5. Consequently, the power circuit section 1 is completely insulated from the heat radiation member 2.

Then, a suitable portion of the power circuit section 1, in particular, the peripheries of the power circuit section 1 and the FETs 12 are pressed through the upper end opening 32 in the enclosure wall member 30 to firmly secure the power circuit section 1 to the circuit arrangement area on the heat radiation member 2. Thus, the bus bars 10 disposed on the rear side of the power circuit section 1 are embedded in the adhesive by pressing the power circuit section 1 to join the section 1 to the heat radiation member 2. Consequently, it is possible to prevent a short circuit between the bus bars 10 and to enhance heat conductivity between the power circuit section 1 and the heat radiation member 2.

The power circuit section 1 is arranged on the circuit arrangement area on the circuit arrangement surface 2*a* of the heat radiation member 2 (e.g., a circuit arrangement step). The enclosure wall member 30 surrounds the circuit arrangement area on the circuit arrangement surface 2*a* of the heat radiation member 2 including the power circuit section 1 to form an enclosure wall. This enclosure wall serves as a bank for the waterproof resin (an enclosure wall forming-step). After performing the enclosure wall forming-step and the circuit arrangement step, a given amount of liquid waterproof resin is filled into a space enclosed by the enclosure wall member 30 and is solidified to form the waterproof layer 6.

In more detail, the heat radiation member 2, to which the enclosure wall member 30 and power circuit section 1 are attached, is set so that the circuit arrangement surface 2*a* is faced upwardly. The liquid waterproof resin is filled through the upper end opening 32 of the enclosure wall member 30 into the space surrounded by the enclosure wall member 30. The waterproof resin is filled into the space until the respective electronic parts (FETs 12) are sealed. At this time, an amount of waterproof resin is set so that the waterproof resin overflows through the terminal through-holes 37 and resin insertion holes 40 into the connector housing 36 and reaches a given height in the resin reservoir recess 39.

When the waterproof resin fills the resin reservoir recess 39, the bus bar assembly 11 including the base portions of the external connection terminals 14 and the control circuit board 13 are dipped in the waterproof resin. On the other hand, because the seal member 4 for a resin surrounds the circuit arrangement area, the liquid waterproof resin does not leak out from a clearance between the heat radiation member 2 and the enclosure wall member 30.

A kind of the waterproof resin is not limited to a special material so long as it has a waterproof property. In the present embodiment, the waterproof resin in a liquid form flows into every corner in the enclosure wall member 30, thereby obtaining a complete seal. If the waterproof resin is used which has certain elasticity and shape retainability after being solidified, it will not affect the FETs 12 and solders. A silicone base resin will be preferable in view of electrical insulation as well as heat resistance and cold resistance. The waterproof resin having a good adhesive property can omit an applying work of a primer or the like and simplify a work. Furthermore, the waterproof resin having a good heat conductive property can promote heat radiation from the waterproof layer 6 as well as the heat radiation member 2, thereby enhancing heat radiation.

Heating solidifies the filled waterproof resin to form the waterproof layer 6. The waterproof layer 6 seals at least a part of the power circuit section 1 within the enclosure wall member 30 and seals the terminal through-holes 37.

After the lid 31 and waterproof layer 6 are formed, the lid 31 is attached to the enclosure wall member 30 so that the lid 31 covers the upper end opening 32 in the enclosure wall member 30. Because the attachment structure has been described above, an explanation of it will be omitted here. Thus, the power module can be produced.

According to this power module, because the waterproof layer 6 is formed within the enclosure wall member 30 and the waterproof layer 6 seals the bus bar assembly 11 except the external connection terminals 14 of the power circuit section 1, the respective electronic parts such as the FETs 12 and the control circuit board 13, it is possible to effectively waterproof the power circuit section 1. Furthermore, the waterproof layer 6 seals the terminal through-holes 37. Because the terminal through-holes 37 in the connector housing 36 are sealed by utilizing the waterproof layer 6 that seals the power circuit section 1, a simple structure can seal the external connection terminals 14 including the terminal through-holes 37 and can also seal a whole of the power module as well as the connector.

In particular, according to the power module in the present invention, because the connector housing 36 is provided in a bottom portion with the resin reservoir recess 39 and the top surface of the waterproof layer 6 is disposed within the resin reservoir recess 39, it is possible to surely seal the terminal through-holes 37, and to waterproof the external connection terminals 14 including the terminal through-holes 37. Furthermore, because the top surface of the waterproof layer 6 is disposed within the resin reservoir recess 39, it is possible to eliminate a failure upon connection of another connector.

If the resin reservoir recess 39 is not provided in the connector housing 36, the waterproof layer 6 formed in the connector housing 36 to seal the terminal through-holes 37 projects from the bottom surface (the horizontal wall portion 33*b*) of the connector housing 36. In the case where another connector is connected to the connector housing 36 so that a distal end of another connector contacts with the bottom surface of the connector housing 36, the waterproof layer 6 will interfere with the distal end of another connector. In the present embodiment, because the top surface of the waterproof layer 6 is disposed within the resin reservoir recess 39, the distal end of another connector contacts with the connector contact surface 36*a* to be positioned, thereby keeping the connection.

If the waterproof resin is composed of a silicone base resin that has a certain viscosity after being solidified as in the case of the present embodiment, it is possible to avoid problems in which the waterproof resin forming the waterproof layer sticks to another connector, or any layer is generated on a part of the external connection terminal 14 to cause a contact failure.

According to the method for producing the power module of the present invention, because the waterproof layer 6 is formed to seal a part of the power circuit section 1 by filling the liquid waterproof resin into the space enclosed by the enclosure wall member 30 and solidifying the resin, it is possible to waterproof the power circuit section 1. Because a part of the waterproof resin flows through the terminal through-holes 37 into the connector housing 36 and the waterproof layer 6 is formed in the connector housing 36 so that the waterproof resin seals the terminal through-holes 37, it is not necessary to add a step of waterproofing the connector and to effectively waterproof a whole of the power module as well as the connector. Furthermore, because the connector can be easily waterproofed, an efficiency of production can be enhanced.

Because the height of the bottom surface of the resin reservoir recess 39 is set to be substantially equal to the height of the FET 12, it is possible to seal the power circuit section 1 including the FET 12 when the terminal through-holes 37 are sealed and to waterproof a whole of the power module by a small amount of waterproof resin. Furthermore, when the waterproof resin flows in the resin reservoir recess 39, the waterproof resin will seal the power circuit section 1 including the FETs 12, thereby making a reference for a filling amount of waterproof resin. Because the upper edge of the resin reservoir recess 39 is set to be higher than the upper end of the FET 12, it is possible to seal a whole of the FET 12 by the waterproof layer 6. Under the condition, the waterproof resin will not overflow out of the resin reservoir recess 39. Accordingly, it is possible to keep the connection between the connector housing and another connector while waterproofing a whole of the power module.

Although the power module-and the method for producing the same are described in the above embodiments, the present invention is not limited to the above embodiments. A various kinds of modifications can be done within the scope of the spirit of the invention without departing from the spirit.

The order of the respective steps is not limited to the above embodiments in which the circuit arrangement step and the enclosure wall forming-step are performed simultaneously. For example, the enclosure wall forming-step may follow the circuit arrangement step. However, if the enclosure wall forming-step is performed simultaneously with the circuit arrangement step, it Will be easier to position the power circuit section 1, thereby enhancing an efficiency of production.

In the above embodiment, the connector housing is integrated with the enclosure wall member 30 and the connector forming-step and the enclosure wall forming-step are performed simultaneously. However, the connector housing 36 may be produced independent of the enclosure wall member 30 or may be integrated with the lid 31. It is necessary to dispose a bottom portion of the connector housing 36 below an upper edge of the enclosure wall member 30. A shape of the power module is not limited to the shape disclosed in the above embodiment but it may be any shape.

In the above embodiment, the waterproof resin is selected from a thermoplastic resin and the waterproof layer 6 is formed when the waterproof resin is solidified. However, a method of forming the waterproof layer 6 is not limited to this manner. Solidifying the waterproof resin naturally while leaving the waterproof resin for a long period in time may form the waterproof layer 6.

The entire disclosure of Japanese Patent Application No. 2003-036469 filed on Feb. 14, 2003 including the specification, claims, drawings and summary is incorporated herein by reference in its entirety.

While the present invention has been particularly described, in conjunction with a specific preferred embodiment, it is evident that many alternatives, modifications, and variations will be apparent to those skilled in the art in light of the foregoing description. It is therefore contemplated that the appended claims will embrace any such alternatives, modifications, and variations as falling within the true scope and spirit of the present invention.

What is claimed is:

1. A power module wherein a power circuit section including a plurality of bus bars is disposed through an insulation layer on a circuit arrangement surface of a heat radiation member, comprising:

an external connection terminal formed by folding up an end of each of said bus bars from said circuit arrangement surface;

an enclosure wall member disposed on said heat radiation member to surround said power circuit section including said external connection terminal;

a connector housing constituting an external connection connector that includes a bottom portion and a hood, said bottom portion being provided with a terminal through-hole into which said external connection terminal is inserted, said hood surrounding said external connection terminal that projects through said terminal through-hole toward the opposite side from said circuit arrangement surface, said external connection connector being adapted to be coupled to another connector together with said external connection terminal; and a waterproof layer formed within said enclosure wall member so that at least a part of said power circuit section is sealed and said terminal through-hole is sealed.

2. A power module according to claim 1, wherein said waterproof layer is formed by filling an inside of said enclosure wall member with a liquid waterproof resin, flowing a part of said waterproof resin through said terminal through-hole into said connector housing, and solidifying said waterproof resin.

3. A power module according to claim 1, wherein said connector housing is integrated with said enclosure wall member.

4. A power module according to claim 2, wherein said connector housing is integrated with said enclosure wall member.

5. A power module according to claim 1, wherein said connector housing is provided in a bottom wall, except a connector contact surface on which a distal end of another connector contacts, with a resin reservoir recess depressed toward said heat radiation member, wherein said terminal through-hole is formed in said resin reservoir recess, and wherein a top surface of said waterproof layer is positioned within said resin reservoir recess.

6. A power module according to claim 2, wherein said connector housing is provided in a bottom wall, except a connector contact surface on which a distal end of another connector contacts, with a resin reservoir recess depressed toward said heat radiation member, wherein said terminal through-hole is formed in said resin reservoir recess, and wherein a top surface of said waterproof layer is positioned within said resin reservoir recess.

7. A power module according to claim 3, wherein said connector housing is provided in a bottom wall, except a connector contact surface on which a distal end of another connector contacts, with a resin reservoir recess depressed toward said heat radiation member, wherein said terminal through-hole is formed in said resin reservoir recess, and wherein a top surface of said waterproof layer is positioned within said resin reservoir recess.

8. A power module according to claim 5, wherein a plurality of terminal through-holes are provided in said resin reservoir recess.

9. A method for producing a power module, comprising:

arranging on a circuit arrangement surface of a heat radiation member a power circuit section including a plurality of bus bars and an external connection terminal formed by folding up an end of at least one of said bus bars;

attaching closely to said circuit arrangement surface an enclosure wall member that surrounds said power circuit section including said external connection terminal;

forming an external connection connector adapted to be coupled to another connector through said external connection terminal that is inserted into said terminal through-hole in a connector housing, said connector housing including a bottom portion and a hood, said bottom portion being provided with said terminal through-hole into which said external connection terminal is inserted, and said hood surrounding said external connection terminal that projects through said terminal through-hole toward the opposite side from said circuit arrangement surface; and forming a waterproof layer for sealing at least a part of said power circuit section and for sealing said terminal through-hole by filling a space enclosed by said enclosure wall member with a liquid waterproof resin, flowing said waterproof resin into said connector housing to a given level, and solidifying said waterproof resin.

10. A method for producing a power module according to claim 9, wherein said enclosure wall member integrated with said connector housing is attached to said circuit arrangement surface in said second and third steps.

11. A method for producing a power module according to claim 9, wherein said enclosure wall member has a seal member for said resin on an end surface opposed to said heat radiation member, and wherein said enclosure wall member is attached to said circuit arrangement surface in the step for attaching the enclosure wall member so that said seal member for said resin is contacted closely with said circuit arrangement surface.

12. A method for producing a power module according to claim 10, wherein said enclosure wall member has a seal member for said resin on an end surface opposed to said heat radiation member, and wherein said enclosure wall member is attached to said circuit arrangement surface in the step for attaching the enclosure wall member so that said seal member for said resin is contacted closely with said circuit arrangement surface.

13. A method for producing a power module according to claim 9, wherein the step for forming the external connection connector uses, as the connector housing forming said external connection connector, a connector housing provided in a bottom wall, except the connector contact surface on which a distal end of another connector contacts, with a resin reservoir recess that is depressed toward said heat radiation member and is provided with the terminal through-hole, and wherein the step for forming the waterproof layer fills said resin reservoir recess with said waterproof resin until a top surface of said waterproof layer reaches a given level in said resin reservoir recess.

14. A method for producing a power module according to claim 10, wherein the step for forming the external connection connector uses, as the connector housing forming said external connection connector, a connector housing provided in a bottom wall, except the connector contact surface on which a distal end of another connector contacts, with a resin reservoir recess that is depressed toward said heat radiation member and is provided with the terminal through-hole, and wherein the step for forming the waterproof layer fills said resin reservoir recess with said waterproof resin until a top surface of said waterproof layer reaches a given level in said resin reservoir recess.

15. A method for producing a power module according to claim 11, wherein the step for forming the external connection connector uses, as the connector housing forming said external connection connector, a connector housing provided in a bottom wall, except the connector contact surface on which a distal end of another connector contacts, with a resin reservoir recess that is depressed toward said heat radiation member and is provided with a terminal through-hole, and wherein the step for forming the external connection connector fills said resin reservoir recess with said waterproof resin until a top surface of said waterproof layer reaches a given level in said resin reservoir recess.

16. A method for producing a power module according to claim 13, wherein the arranging step uses, as the power circuit section to be arranged on a circuit arrangement area, the power circuit section including one or more electronic parts having a leg-like terminal, and wherein the step for forming the external connection connector uses, as the connector housing forming said external connection connector, a connector housing in which a bottom surface of said resin reservoir recess is set to be higher than an upper end of said leg-like terminal upon filling of said waterproof resin.

17. A method for producing a power module according to claim 13, wherein the step for forming the external connection connector uses, as a connector housing forming said external connection connector, the connector housing in which an upper edge of said resin reservoir recess is set to be higher than an upper end of said electronic parts upon filling of waterproof resin.

18. A method for producing a power module according to claim 16, wherein the step for forming the external connection connector uses, as the connector housing forming said external connection connector, the connector housing in which an upper edge of said resin reservoir recess is set to be higher than an upper end of said one or moor electronic parts upon filling of said waterproof resin.

* * * * *